United States Patent [19]
Bolie

[11] Patent Number: 5,083,097
[45] Date of Patent: Jan. 21, 1992

[54] ADAPTIVE CONTROL SYSTEM FOR PULSED MEGAWATT KLYSTRONS

[75] Inventor: Victor W. Bolie, Albuquerque, N. Mex.

[73] Assignee: The University of New Mexico, Albuquerque, N. Mex.

[21] Appl. No.: 405,701

[22] Filed: Sep. 11, 1989

[51] Int. Cl.$^5$ ............................................. H03L 7/085
[52] U.S. Cl. ............................................. 331/6; 331/7; 331/14; 331/15; 331/17; 331/183
[58] Field of Search ............ 331/6, 7, 14, 15, 17, 331/183; 328/155; 332/107

[56] References Cited

U.S. PATENT DOCUMENTS

| | | | |
|---|---|---|---|
| 3,461,401 | 8/1969 | Williams | 331/183 X |
| 3,500,226 | 3/1970 | Eisenberg | 331/15 |
| 3,740,656 | 6/1973 | Riley | 332/107 |
| 4,418,318 | 11/1983 | Swagerty et al. | 328/155 |

OTHER PUBLICATIONS

Boussard, D., "Control of Cavities with High Beam Loading", IEEE Transactions on Nuclear Science, vol. NS-32, No. 5, Oct. 1985.

Pedersen, F., "Beam Loading Effects in the CERN PS Booster", IEEE Transactions on Nuclear Science, vol. NS-22, No. 3, Jun. 1975.

Schulze, D., "New Methods of RF-Control for the SNQ", Jun. 25, 1981, Kernforschungszentrum Karlsruhe, Institut fur Kernphysik, Postfach 3640, D-7500 Karlsruhe, Federal Republic of Germany.

*Primary Examiner*—Siegfried H. Grimm
*Attorney, Agent, or Firm*—Albert Sopp

[57] ABSTRACT

The invention provides an arrangement for reducing waveform errors such as errors in phase or amplitude in output pulses produced by pulsed power output devices such as klystrons by generating an error voltage representing the extent of error still present in the trailing edge of the previous output pulse, using the error voltage to provide a stored control voltage, and applying the stored control voltage to the pulsed power output device to limit the extent of error in the leading edge of the next output pulse.

16 Claims, 13 Drawing Sheets

ADAPTIVE CONTROL SYSTEM FOR PULSED MEGAWATT KLYSTRONS

This invention was made in the performance of work under a contract or subcontract with the U.S. Department of Energy, and the United States Government has certain rights therein.

BACKGROUND OF THE INVENTION

Large-size klystrons operating in the 300–3000 MHz frequency range with pulsed RF outputs in the 1–2 megawatt power range have been used increasingly in ground-based radar systems and in particle accelerator systems in recent years. In a growing number of applications, such as those requiring Doppler measurements on tumbling radar targets and precisely timed excitations of accelerator cavities, there is a need for more accurate control of the phase and amplitude of the klystron output. For such applications, conventional RF amplitude control loops and RF phase-locked control loops are found to be only marginally adequate because they do not fully compensate for errors in the phase and amplitude of the output pulses.

Some of the prior art systems addressing the problem of phase and amplitude control include a combination of RF feedback and feedforward corrections as discussed in "Control of Cavities with High Beam Loading," Boussard, D., IEEE Transactions on Nuclear Science, Vol. NS-32, No. 5, October 1985; the use of beam loading interaction employing AF feedback loop for amplitude, phase, and cavity loading including use of loops to compensate for cross coupling, described in "Beam Loading Effects in the CERN PS Booster," Pedersen, F., IEEE Transactions on Nuclear Science, Vol. NS-22, No. 3, June 1975; and use in a linear accelerator of a computer model of an amplitude and phase control system for automatic adjustment of the feedforward beam combination pulse and use of a phase step during detuned turn-on, as described in "New Methods of RF-Control for the SNQ," Schulze, D., Kernforschungszentrum Karlsruhe, Institut fur Kernphysik, Postfach 3640, D-7500 Karlsruhe, Federal Republic of Germany, June 25, 1981.

One inherent difficulty is that the conventional RF amplitude and phase control loops do not provide for automatic self-assessment of the initial errors otherwise prevailing at the beginning of each RF output power pulse, and the gradual elimination of these initial errors from the succeeding output pulses. These and other problems of control of megawatt klystrons or other pulsed RF power devices are overcome by this invention.

FIELD OF THE INVENTION

This invention relates generally to pulse control systems for high power devices such as klystrons and more particularly to a control arrangement employing a learning technique which not only includes phase-and-amplitude correcting feedback loops operating throughout RF output pulse, but also includes provisions whereby any incompletely cancelled error present at the end or trailing edge of an RF output pulse is remembered and used to advantage in reducing the initial error otherwise present at the beginning of the next RF output pulse. Thus, the invention provides an arrangement wherein, as a broad concept, the initial error that, but for the arrangement of the present invention, would be present in each next RF output pulse is reduced to the extent of the error existing at the end of the previous pulse. Stated another way, the arrangement of the present invention provides a memory of the error level in the trailing edge of the previous pulse and constrains the initial error level in the next pulse to the level of error in the trailing edge of the previous pulse.

OBJECTS OF THE INVENTION

An object of this invention is to provide a highly accurate phase and amplitude control system for output devices and particularly for pulsed high-frequency high-power output devices such as klystrons.

Another object of this invention is to provide error control loops for pulsed high-power klystrons which automatically "learn" through analysis of the waveform characteristics of past pulses to properly set the initial conditions for the waveform characteristics, such as phase and amplitude, for each future pulse.

Another object of this invention is to provide a control system for pulsed high-power klystrons which adaptively inserts any needed second-order corrections in the phase and amplitude of an output pulse of any desired intensity.

Other objects and advantages of the control system of this invention will become apparent in the following description of the invention.

DESCRIPTION OF THE INVENTION

Figure 1:
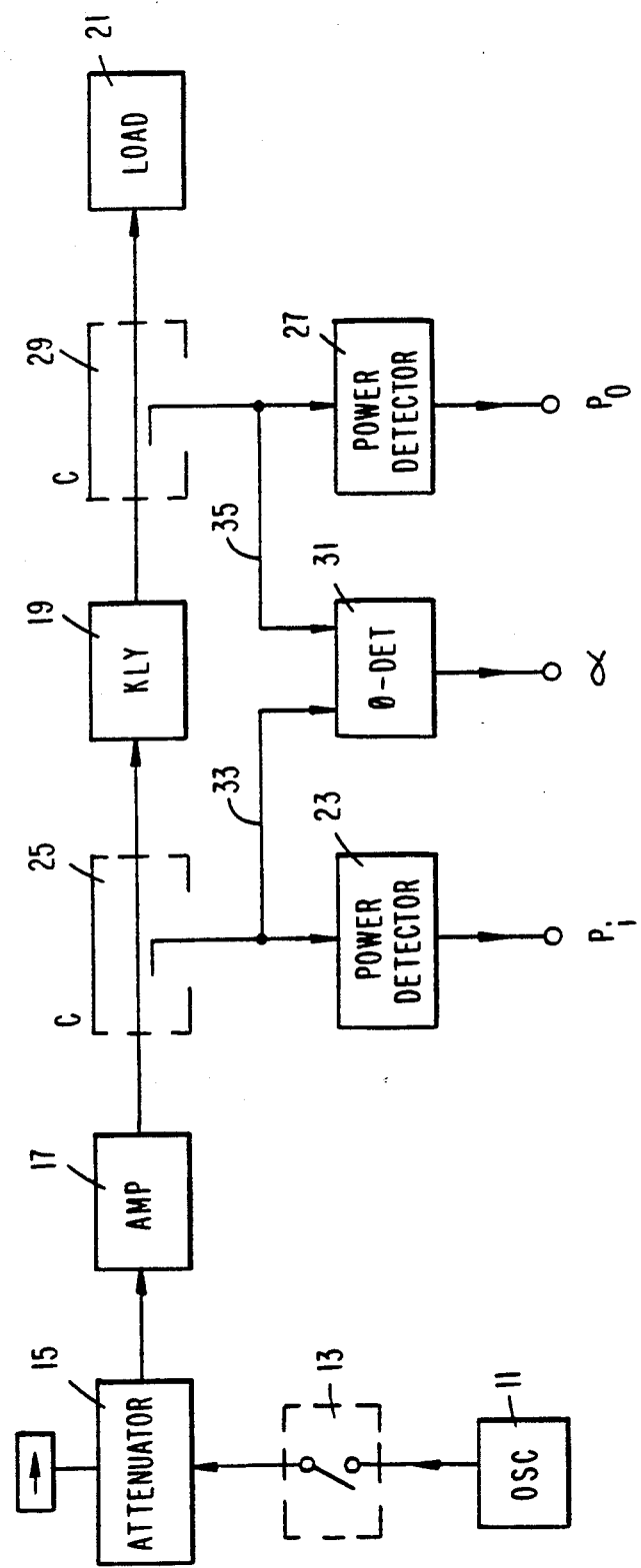
FIG. 1 shows for introductory purposes a typical, prior art circuit for measuring the performance characteristics of a high-power klystron.

Turning now to FIG. 1, the types of klystron nonlinearities to be corrected by the system of this invention may be detected and measured by use of the illustrated test circuit, which includes in a first series-connected combination the following components which may be of any suitable construction well known in the art: a fixed-frequency UHF oscillator 11, a diode-type UHF switch 13, a variable attenuator 15, and a solid-state UHF amplifier 17. The output of amplifier 17 feeds a second series-connected combination which includes a conventional megawatt klystron 19 connected to a matched-impedance load 21. The switch 13 is typically operated at a pulse frequency of 5 to 10 Hz with a duty cycle of 0.5 to 1.0 percent. The attenuator 15 is of any suitable well known construction and is typically operated so that the peakpulse output power of the amplifier 17 ranges from zero to 400 watts. The input power to the klystron 19 is measured by using a power detector 23 of any suitable well known construction fed from a first conventional UHF coupler 25 at the klystron input. Similarly, the klystron output power is measured by using another power detector 27 of any suitable well known construction fed from a second UHF coupler 29 at the output of klystron 19. The input-to-output phase lag of the klystron is measured by a conventional phase detector 31 fed via lines 33 and 35 from the input and output coupler 25 and 29. The UHF operating frequency of the oscillator, amplifier, and klystron may typically be in the vicinity of 425 MHz.

Figure 2:
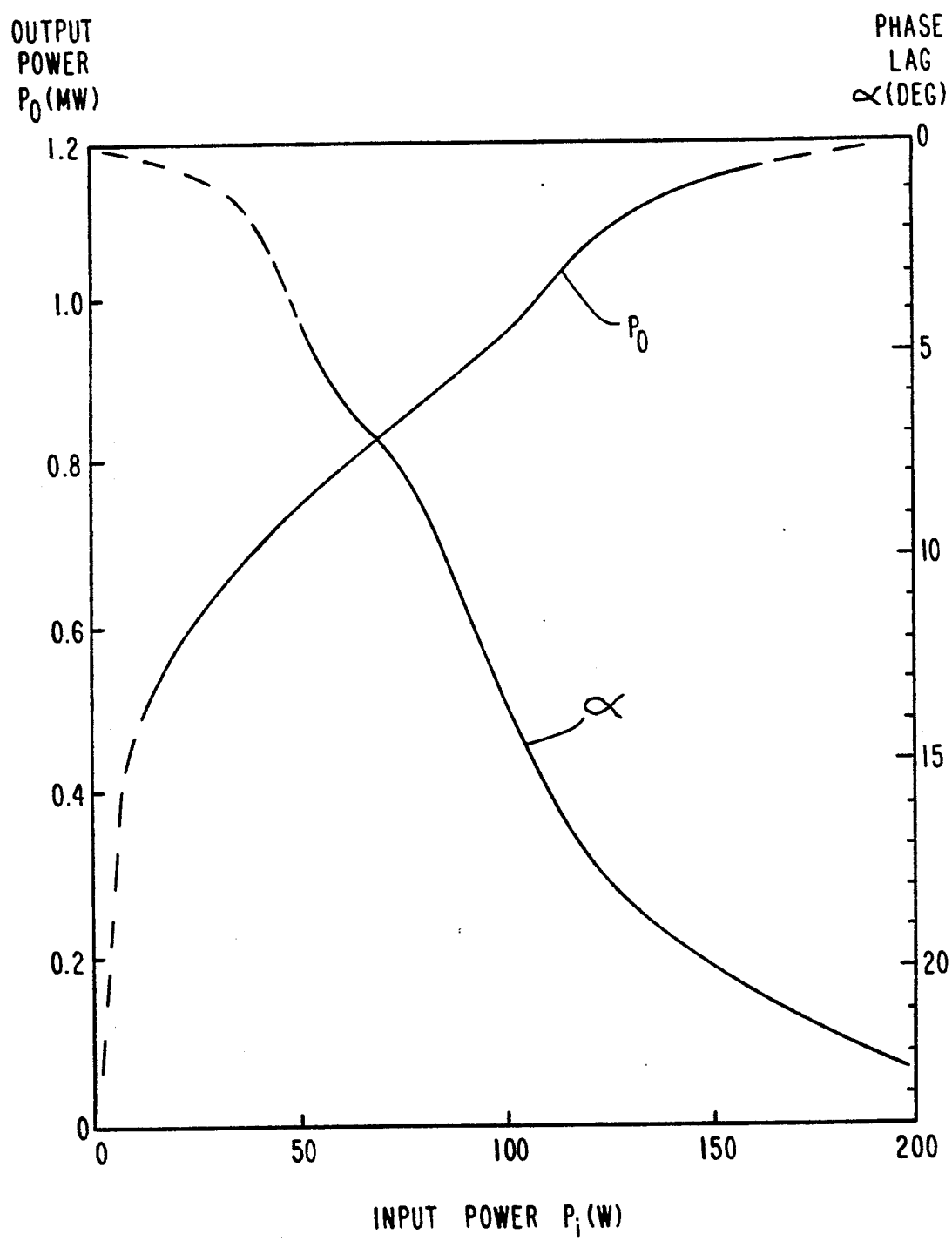
FIG. 2 shows in graphical form some typical results of tests made with the circuit of FIG. 1.

The results of using the circuit of FIG. 1 to test a typical megawatt klystron (such as the Model L-5773 Klystron manufactured by the Litton Corporation of San Carlos, Calif.) are shown in FIG. 2, in which the output power $P_o$ and the input-to-output phase lag angle $\alpha$ are plotted as functions of the input power $P_i$. It is seen from the $P_o$ plot in this example that the pulsed output power rises in a highly nonlinear manner from zero to 1.2 megawatts as the correspondingly pulsed input power is increased from zero to 200 watts. From the $\alpha$ plot it is seen that, far from being constant, the phase lag angle increases in a roughly linear manner from zero to 23 degrees as the input power is increased from zero to 200 watts.

Figure 3:
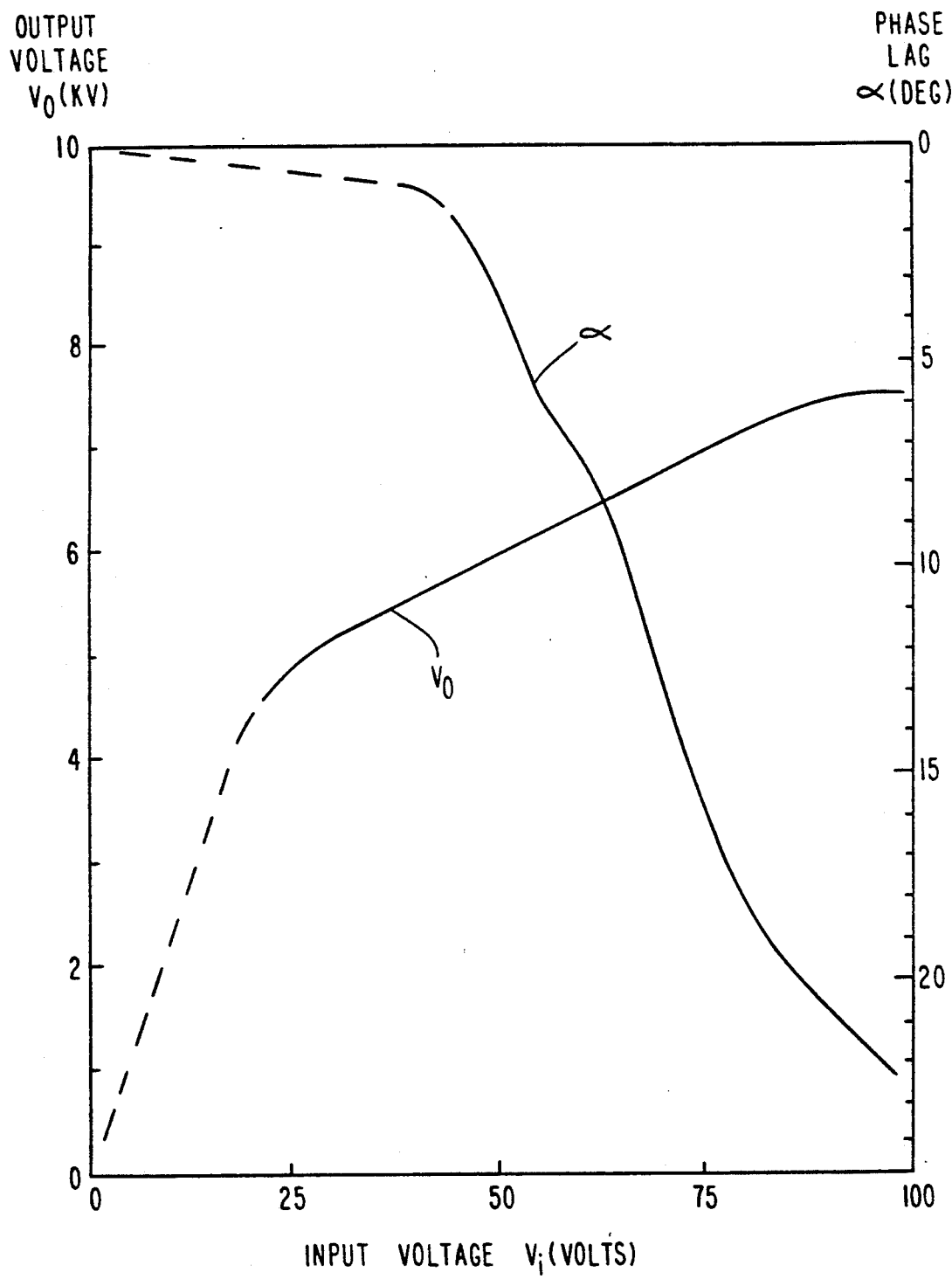
FIG. 3 shows in graphical form the data of FIG. 2, with the input and output intensities expressed as voltages.

The coaxial input and output impedances of a high-power klystron may each be typically equal to 50 ohms. Accordingly, the data of FIG. 2 may be more conveniently illustrated as shown in FIG. 3, in which the output voltage $V_o$ and the input-to-output phase lag $\alpha$ are plotted as functions of the input voltage $V_i$. Thus, it is seen from the $V_o$ plot that the output voltage rises in a downwardly concave and nearly bilinear manner from zero to 7750 volts as the input voltage is increased from zero to 100 volts. The corresponding initial and final bi-segment gains are approximately 47 and 23 dB, respectively. From the $\alpha$ plot it is seen that the phase lag angle increases in an upwardly concave and roughly bilinear manner from zero to 23 degrees as the input voltage is increased from zero to 100 volts. The initial and final bi-segment phase-lag sensitivities are approximately 0.03 and 0.40 degrees per input volt, respectively.

For certain applications, such as those involving the use of a pulsed power device such as a klystron to deliver carefully timed UHF power pulses of precisely adjustable amplitude and phase to each resonant cavity of a modern particle accelerator, the amount of nonlinearity and phase-vs-amplitude cross-coupling in the klystron characteristics illustrated by the plots in FIG. 3 could compromise or degrade the performance of any added phase and amplitude control loops. However, the amplifier supplying the input signal to the klystron can be modified to include an amplitude-sensitive gain element and an amplitude-sensitive phase-advance element which together compensate for some of the amplitude nonlinearity and some of the phase-vs-amplitude cross-coupling in the klystron.

Figure 4:
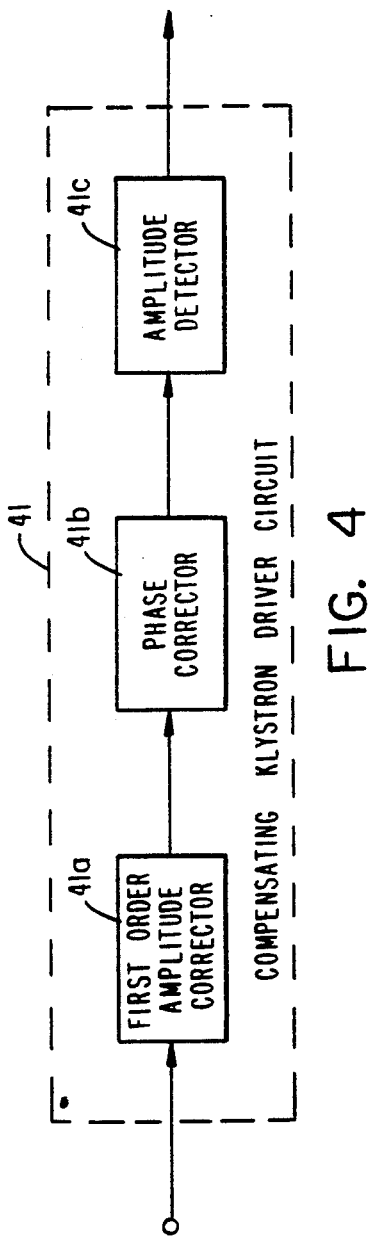
FIG. 4 is a schematic block diagram of a partially compensating klystron driver circuit incorporating a linear amplifier plus first-order amplitude-and-phase correctors in accordance with known procedures.

Methods and designs for constructing first-order amplitude and phase correctors for UHF signals are well known in the electronic art. For example, voltage-controlled phase shifters and current-controlled attenuators may be obtained from the General Microwave Corporation of Amityville, N.Y., and nonlinear function generators may be obtained from the Burr-Brown Corporation of Tucson, Ariz. A compensating klystron driver circuit 41 of known design incorporating an appropriate first-order amplitude corrector 41a a phase corrector 41b, and an amplitude detector 41c is shown schematically in FIG. 4.

Figure 5:
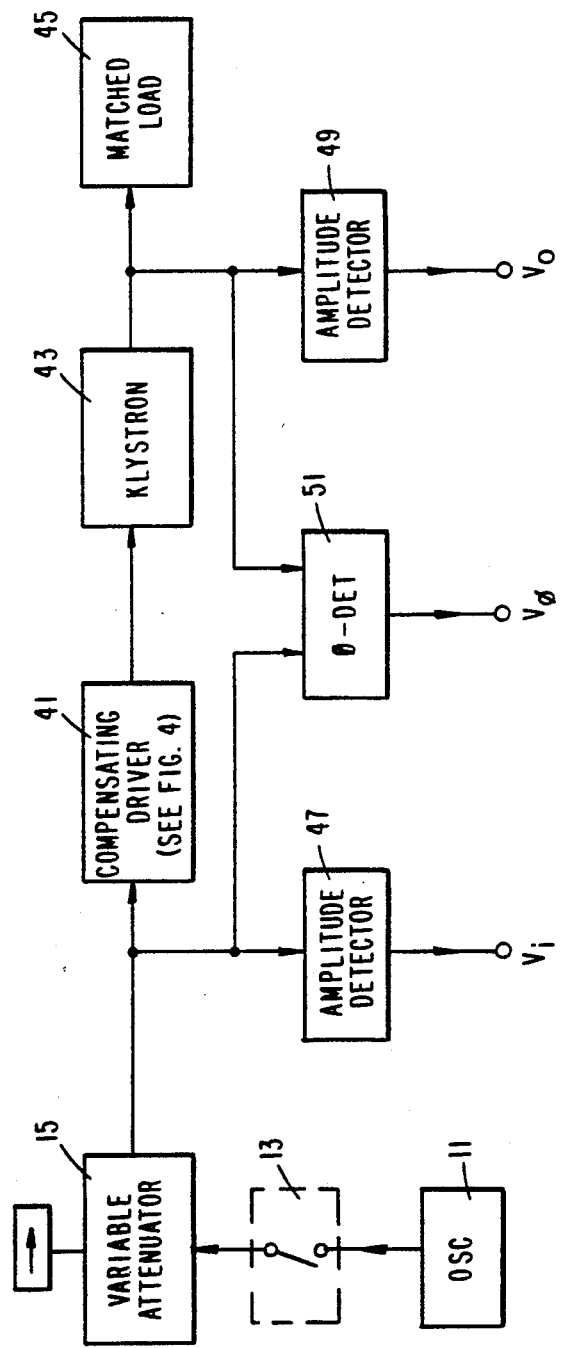
FIG. 5 shows a test circuit in accordance with an embodiment of the present invention for measuring the performance characteristics of a high-power klystron connected in series with the compensating driver of FIG. 4.

Turning next to FIG. 5, the modified test circuit shown diagrammatically therein differs from that shown in FIG. 1 and includes a first series-connected combination of the following well known components: a fixed-frequency UHF oscillator 11, a diode-type UHF switch 13, and a variable attenuator 15 feeding a second series-connected combination of a well known, conventional compensating driver 41 (see FIG. 4), klystron 43, and matched load 45. The driver input voltage is sensed by any suitable well known amplitude detector 47 coupled to the driver input, and the klystron output voltage is sensed by another conventional amplitude detector 49 coupled to the klystron output. The driver-input-to-klystron-output phase lag is sensed by a phase detector 51 of any suitable well-known construction fed from the driver input and klystron output.

An advantageous feature of the test circuit of FIG. 5 is that, given the typical 7750-volt maximum klystron output known from prior tests, the maximum value of the output voltage $V_{100}$ of the phase detector and maximum values of the output voltages $V_i$ and $V_o$ of the input and output amplitude detectors are each scaled to be equal to a common value which may typically be equal to 10 volts.

Figure 5A:
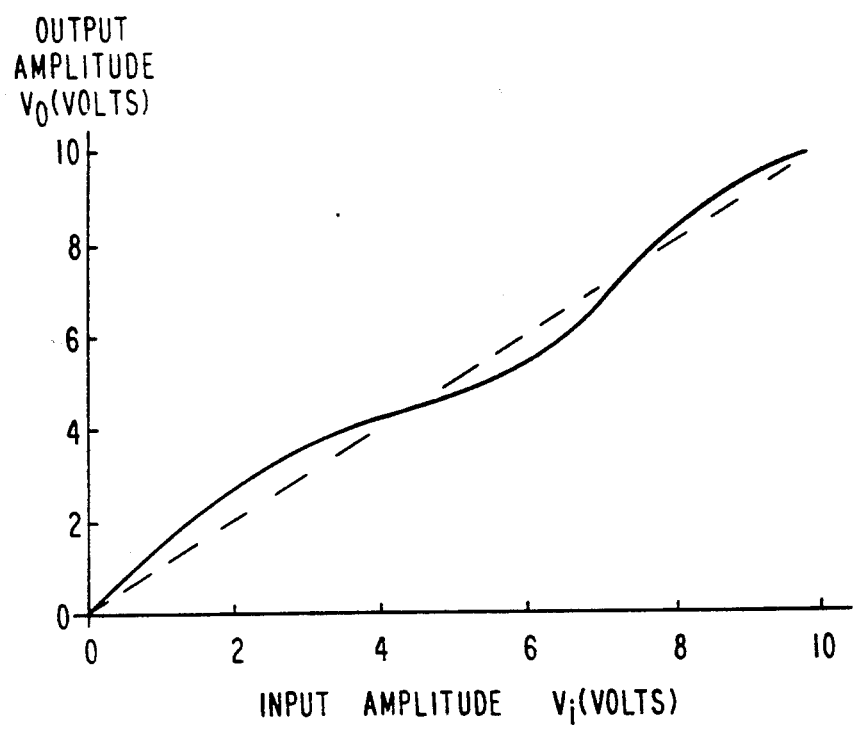
FIGS. 5A and 5B show in graphical form some typical results of tests made with the circuit of FIG. 5.
Figure 5B:
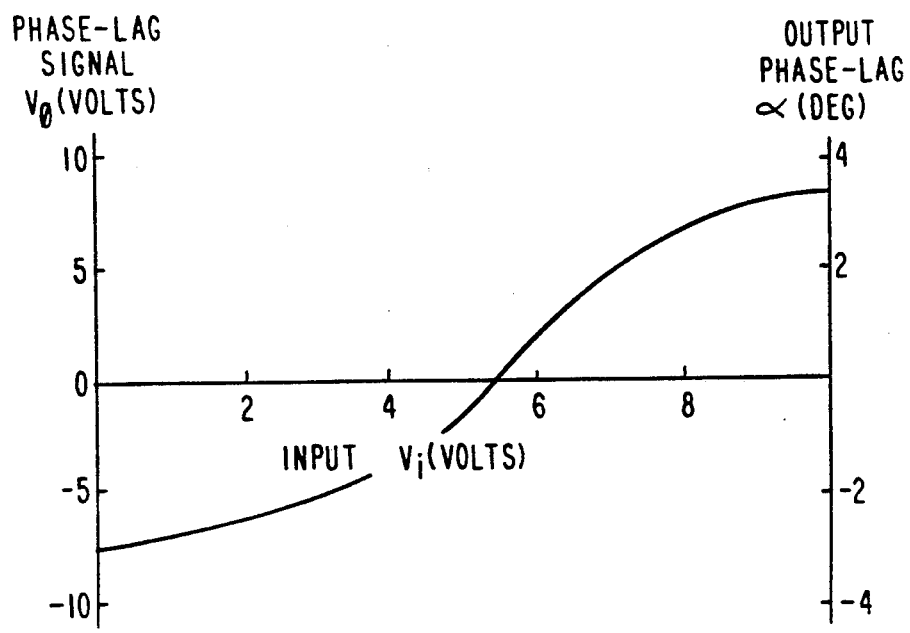

The results of using the circuit of FIG. 5 to test the combined klystron and compensating driver are shown in FIGS. 5A and 5B. In FIG. 5A the signal $V_o$ from the klystron output amplitude detector and in FIG. 5B the signal $V_\phi$ from the klystron output phase detector are plotted as functions of the signal $V_i$ from the driver input amplitude detector. As would be intended and expected, and as shown in FIG. 5A, $V_o$ increases in roughly linear proportion to $V_i$. As shown in FIG. 5B, the phase lag angle $\alpha$ remains small over the entire range of $0 \leq V_i \leq 10$ volts. It should be understood that departures of $V_o$ from close proportionality to $V_i$, and of $\alpha$ from being a near-zero constant independent of $V_i$, can cause operational problems and significant errors.

Figure 6:
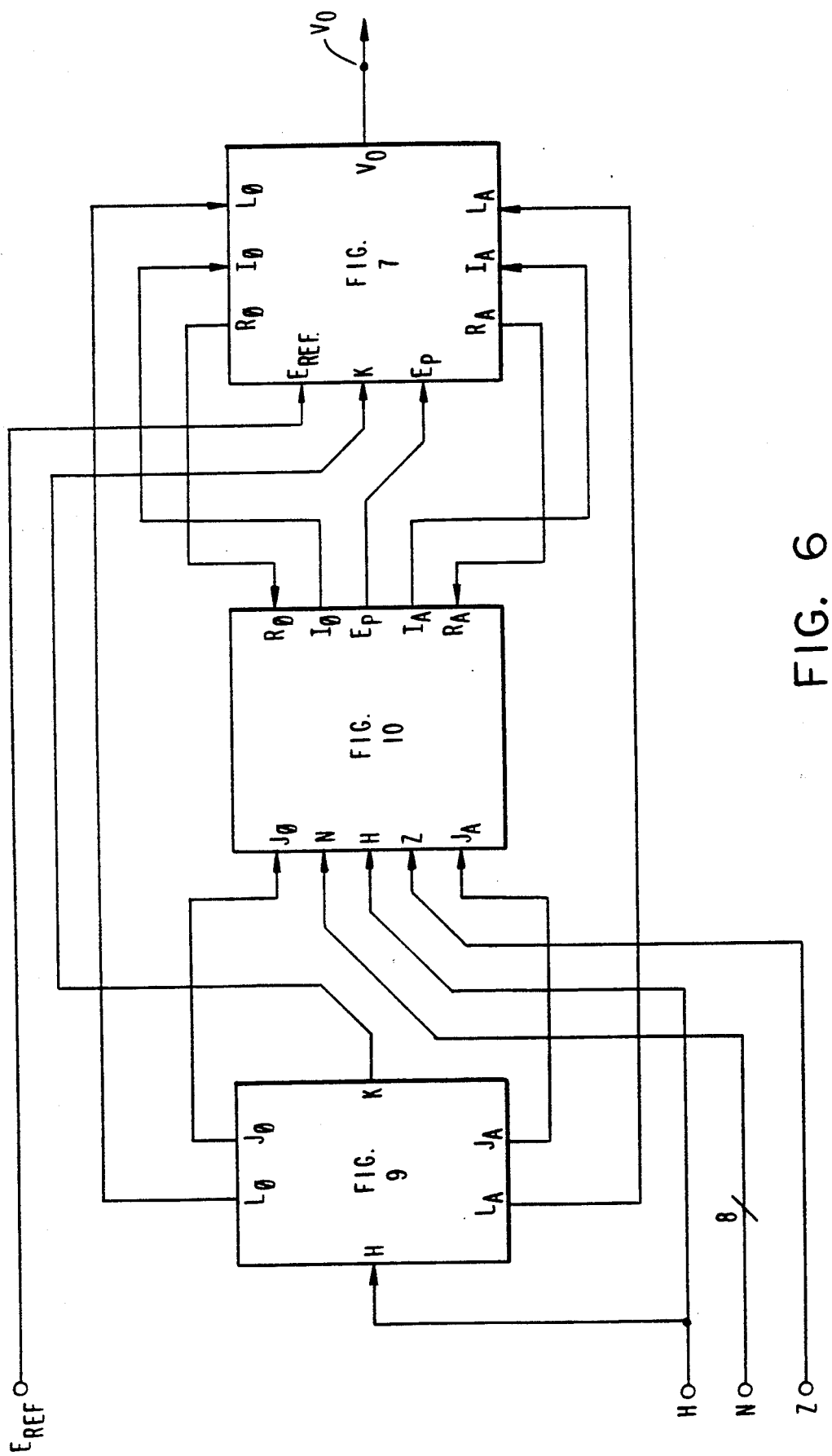
FIG. 6 is a system block diagram of the adaptive control system of the invention showing the interconnections among the major subsystems described in connection with FIGS. 7, 9, and 10.

However, even substantial departures are easily tolerated and cancelled by the advantageous adaptive control system of the invention shown in block diagram form in FIG. 6. More particularly, the system shown in FIG. 6 comprises 3 main portions or subsystems identified with reference to the FIGS. 7, 9, and 10 described hereinbelow. The overall purpose and effect of the klystron adaptive control system of the invention is to enable the speeding up or accelerating of the responses in its phase and amplitude control loops by automatically "learning" the initial corrective conditions required for each output burst of a klystron. In general terms, the system of the invention accomplishes this by remembering the extent of trailing edge error in each previous pulse, generating a control signal from such error to reduce the extent of error in the leading edge or initial portion of each next pulse, and applying the control signal to the output device. The system of the invention accomplishes this by employing a signal $E_{REF}$ of fixed amplitude and desired phase, a scaling voltage, phase and amplitude error signals $E_\phi$ and $E_A$ and stored signals derived therefrom, a digitally designated signal N prescribing the desired amplitude of the klystron output $V_o$, a timing signal H to control the timing of the UHF output bursts of the klystron, and a counter reset control pulse Z.

Figure 7:
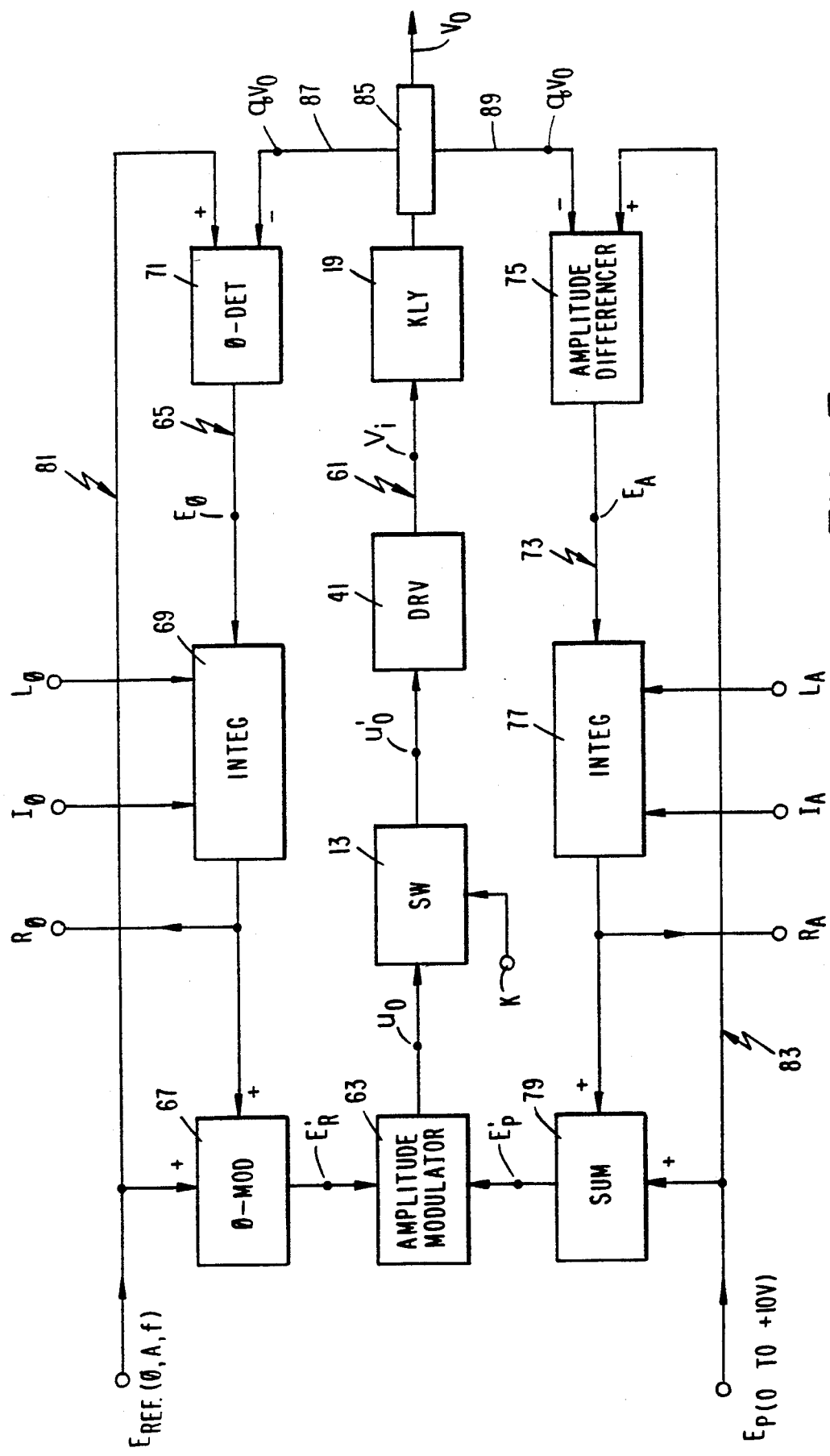
FIG. 7 illustrates in schematic block diagram form the primary control unit of the adaptive control system in accordance with an embodiment of this invention.

Turning to the primary adaptive control unit shown in FIG. 7, this unit comprises ten components each of which is well-known in the art and may be of any suitable well-known construction. These are, in a first conductive path 61, the klystron 19, a compensating driver 41, an electronic UHF switch 13, and an amplitude modulator 63; in a second path 65, a phase modulator 67, a first analog integrator 69 and a phase detector 71; and in a third path 73 an amplitude differencing unit 75, a second analog integrator 77, and a voltage summing device 79.

There are seven inputs ($I_\phi$, $L_\phi$, $I_A$, $L_A$, $E_{REF}$, $E_P$, K) and three outputs ($R_\phi$, $R_A$, $V_o$) for the subsystem of FIG. 7. The input $E_{REF}$ is fed via a path 81 to the phase modulator 67 and phase detector 71 and is a continuous low-level UHF reference wave of predetermined amplitude, frequency, and phase. For example, the amplitude may be 2 volts, the frequency 425 MHz, and the phase, zero degrees. A scaling input voltage $E_P$ is fed via a path 83 to the amplitude difference unit 75 and to the summing device 79. The voltage $E_P$ is a selectably fixed positive analog voltage which is typically arranged to be within the range of $0 \leq E_P \leq 10$ volts and which may typically be the output of any suitable digital-to-analog converter set to some desired value by means of any suitable external computer. The input voltage K to the switch 13 is a logic signal which may be arranged to be equal to zero volts whenever the klystron 19 and driver 41 are to be inactive. This signal may be a rectangular pulse train having 5-volts amplitude, 800 μsec duration, and 5 Hz frequency.

The outputs $R_\phi$ and $R_A$ are the respective analog output voltages of the two integrators 69 and 77. The values of $R_{100}$ and $R_A$ are typically in the ranges $-10 \leq R_\phi \leq +10$ volts and $-10 \leq R_A \leq +10$ volts, respectively. The inputs $I_\phi$ and $I_A$ to the respective integrators 69 and 77 are the respective learned initial values of $R_\phi$ and $R_A$ to be loaded into the integrators 69 and 77 respectively prior to the beginning of a desired UHF output pulse from the klystron 19. The values of $I_\phi$ and $I_A$ may be in the ranges $-10 \leq I_\phi \leq +10$ volts and $-10 \leq I_A \leq +10$ volts, respectively. The inputs $L_\phi$ and $L_A$ are short-pulse logic command digital signals from any suitable source such as a computer which trigger the loading of the $I_\phi$ and $I_A$ voltages into the integrators 69 and 77, respectively. For loading, $L_\phi$ and $L_A$ are typically raised from a quiescent level of zero to an active level of +5 volts for a duration of 2 μsec. The output voltage $V_o$ is the 50-ohm UHF output voltage of the klystron 19, equal to zero irrespective of the scaling input voltage $E_P$ when the logic input voltage K is zero, and equivalent to a sine wave of typical 7750-volt amplitude, 425 MHz frequency, and desirably zero phase lag when K = 5 volts and $E_P = 10$ volts.

Referring further to FIG. 7, the phase detector 71 and the amplitude differencing unit 75 each have a positive input and a negative input, with the positive inputs being the system input signal voltages $E_{REF}$ and $E_P$, respectively. The negative inputs are each made by any suitable well known means such as a 58-dB directional coupler 85 to be equal to a small fraction q, of typical value q = 0.00129, of the system output voltage $V_o$. These negative inputs are indicated as $qV_o$ and are fed from directional coupler 85 via path 87 to the phase detector 71 and path 89 to the amplitude differencer 75. The phase detector 71 produces an output error signal voltage $E_\phi$ which is a sinusoidal function of the phase lag α of the negative-input signal voltage $qV_o$ behind the positive-input signal voltage $E_{REF}$. The error signal $E_\phi$ is typically scaled to vary through the range $-10 \leq E_\phi \leq +10$ as α varies through the range $-90 \leq α \leq +90$ degrees.

The amplitude differencer 75 produces an output error-signal voltage $E_A$ which is proportional to the algebraic difference comprising the positive-input signal voltage $E_P$ minus the appropriately scaled and smoothed amplitude $|qV_o|$ of the negative-input signal voltage $qV_o$, and which in turn is typically scaled to vary through the range $-10 \leq E_A \leq +10$ volts as the algebraic difference ($E_P - |qV_o|$) varies through the range $-10 \leq (E_P - |qV_o|) \leq +10$ volts. The construction and operation of the phase detector 71 and the amplitude differencing unit 75 to produce these voltages are well known in the electronic art. For example, UHF amplitude level detectors, UHF linear amplifiers, and UHF phase detectors such as those included in the elements 75 and 71 respectively may be obtained respectively from the Watkins-Johnson Corporation of Palo Alto, Calif., the Comlinear Corporation of Fort Collins, Col., and the Mini-Circuits Corporation of Brooklyn, N.Y.

The two analog integrators 69 and 77 shown in FIG. 7 inherently have respective time constants $T_\phi$ and $T_A$ and respectively receive the following inputs: analog error voltage inputs $E_\phi$ and $E_A$, logic-pulse inputs $L_\phi$ and $L_A$, initial-value inputs $I_\phi$ and $I_A$, and produce analog outputs $R_\phi$ and $R_A$. The time constants $T_\phi$ and $T_A$ may typically have the values $T_\phi = T_A = 100$ μsec. Integrator 69 has the analog input error voltage $E_\phi$, the logic-pulse input voltage $L_\phi$, the analog initial-value input voltage $I_\phi$, which together provide an updated analog output voltage $R_\phi$ in accordance with the equation:

$$R_\phi = I_\phi + T_\phi^{-1} \int_o^t E_\phi dt, \quad (1)$$

in which time t begins at the end of the logic-pulse input $L_\phi$ serving as a load-$I_\phi$ command.

Similarly, the integrator 77 has the analog input error voltage $E_A$, the logic-pulse input voltage $L_A$, and the analog initial-value input voltage $I_A$ which produce an updated analog output voltage $R_A$ in accord with the equation:

$$R_A = I_A + T_A^{-1} \int_0^t E_A dt, \tag{2}$$

in which time t begins at the end of the logic-pulse input $L_A$ serving as a load-$I_A$ command.

Thus, as shown in FIG. 7, the error voltage outputs $E_\phi$ and $E_A$ of the phase detector 71 and the amplitude differencing unit 75 serve as the respective analog inputs to the integrators 69 and 77. Correspondingly, the output $R_\phi$ of integrator 69 is made to serve as the analog control input to the UHF phase modulator 67, and the output $R_A$ of integrator 77 is made to serve as a first of two analog inputs for the voltage summing device 79. The second of the two inputs to the summing device 79 is the system scaling-input voltage $E_P$. The UHF signal input to the phase modulator 67 is the system reference-input voltage $E_{REF}$.

As further indicated in FIG. 7, the UHF output signal voltage $E'_R$ of the phase modulator 67 is essentially a replica of the system reference-input voltage $E_{REF}$ but advanced in phase by an angle which is proportional to the control input voltage $R_\phi$. The sensitivity of the phase modulator 67 may typically be equal to 9 degrees of phase advance of $E'_R$ ahead of $E_{REF}$ per volt increase in the control input signal $R_\phi$. The output signal $E'_P$ of the voltage summing device 79 is arranged to be in accord with the equation:

$$E'_P = \tfrac{1}{2}(E_P + R_A) + |E_P + R_A|), \tag{3}$$

so that in all cases $E'_P$ remains positive and within the range $0 \leq E'_P \leq +10$ volts.

The amplitude modulator 63 is arranged so that its UHF input signal is the output voltage $E'_R$ of the phase modulator 67 and so that its modulating control signal input is the output voltage $E'_P$ of the amplitude summing device 79. The UHF output voltage $U_o$ of the amplitude modulator 63 is made to serve as the UHF input to the UHF switch 13. As mentioned earlier, the on-off control input to the switch 13 is the system logic input signal K. The output signal voltage $U'_o$ of the UHF switch 13 is made to serve as the input signal to the klystron driver 41. Finally, the output signal from the driver 41 serves as the UHF input signal $V_i$ to the klystron 19.

Thus, in FIG. 7 the respective outputs $U_o$, $U'_o$, and $V_i$ of the modulator 63, the switch 13, and the driver 41 are UHF signals of 425 MHz typical frequency. The amplitude of $U_o$ is proportional to $E'_P$ and is typically equal to 2 volts when $E'_P = 10$ volts. The amplitude of $U'_o$ is zero when $K = 0$ and equal to the amplitude of $U_o$ when $K = 5$ volts. The amplitude of $V_i$ is monotonically increasing with, and roughly proportional to, the amplitude of $U'_o$ and typically equal to 100 volts when $E'_P = 10$ volts and $K = 5$ volts. The phase lead of $U'_o$ with respect to $E_R$ is proportional to $R_\phi$, and typically equal to $+90$ degrees when $R_\phi = 10$ volts.

In the system of FIG. 7, upon activation of K to 5 volts and upon termination of the $L_A$ pulse, the action of the differencer 75, integrator 77, summing device 79, amplitude modulator 63, switch 13, driver 41, and the klystron 19 in the loop defined by paths 89, 73, and 61 brings the amplitude of the klystron output $V_o$ into scaled proportional agreement with the scaling input voltage $E_P$. Similarly, upon activation of input voltage K to 5 volts and upon termination of the $L_\phi$ pulse, the action of the phase detector 71, integrator 69, phase modulator 67, amplitude modulator 63, switch 13, driver 41, and klystron 19 in the loop including paths 87, 65, and 61 brings the phase of the klystron output $V_o$ into agreement with the phase of the reference input $E_{REF}$.

Figure 8:
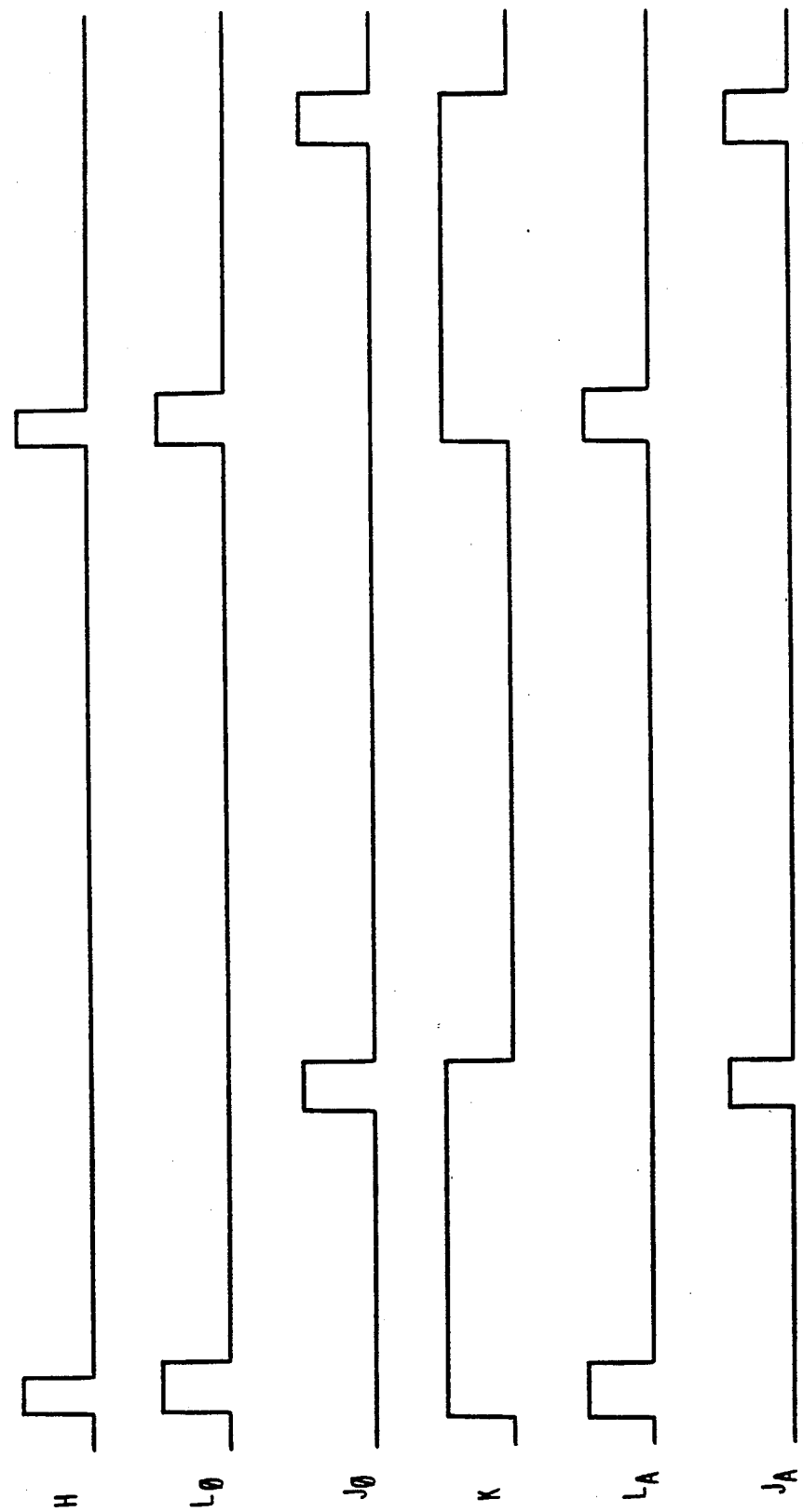
FIG. 8 is a timing diagram for the logic signals controlling the various system components of this invention.

Turning next to the waveform timing diagram of FIG. 8 for the system of FIG. 7 the time progressions of six separate waveforms (H, $L_\phi$, $J_\phi$, K, $L_A$, $J_A$) are illustrated for two complete timing cycles. Each waveform typically has a low level of zero volts and a high level of 5 volts. The controlling clock signal is the H waveform, which is a train of rectangular pulses typically of 1.0 μsec duration and 5 Hz repetition rate. The leading edge of each clock pulse H triggers the K signal to a high state, from which it automatically returns after a time span of typically 800 μsec. The function of the K signal is to activate the UHF switch 13 in FIG. 7. The leading edge of the clock pulse H also triggers each of the $L_\phi$ and $L_A$ signals to a high state, from which they automatically return after a time span of typically 2 μsec. The functions of the $L_\phi$ and $L_A$ signals are to load the initial values $I_\phi$ and $I_A$ into the integrators 69 and 77 in FIG. 7. The 2 μsec overlap of the $L_\phi$ and $L_A$ signals with the K signal allows time for the klystron 19 and driver 41 to respond to the step action of switch 13. Finally, the leading edge of the clock pulse H also turns on a sub-clock which after a time delay of typically 798 μsec triggers each of two logic signals $J_\phi$ and $J_A$ to a high state, from which they automatically return after a time span of typically 2 μsec, in coincidence with the trailing edge of the K pulse. The functions of the $J_\phi$ and $J_A$ signals (further discussed in connection with FIG. 9) are to command external circuits to read and retain the final values of the voltages $R_\phi$ and $R_A$ accumulated during the K pulse by the integrators 69 and 77.

Figure 9:
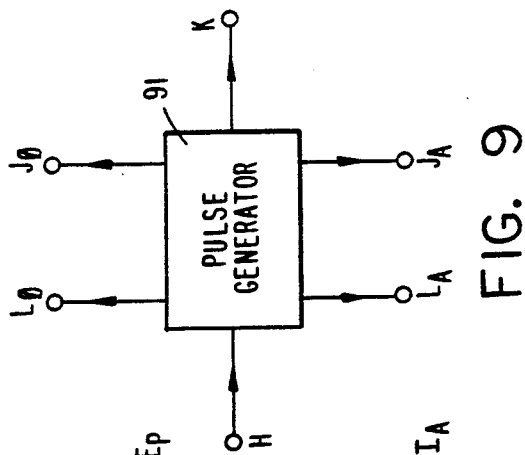
FIG. 9 shows in schematic block diagram form a pulse timer for producing the logic signals discussed in connection with FIG. 8 for the adaptive control system of the invention.

Referring to FIG. 9, there is provided a pulse generator 91 of any suitable well known construction capable of generating the previously discussed signals $L_\phi$, $L_A$, K, $J_\phi$, and $J_A$ from the clock pulse H. These generators, well known in the electronics art, may employ for example a single mono-stable multi-vibrator to produce the $L_\phi$ and $L_A$ signals. The K signal can be the output of a flip-flop which is set by the H pulse and reset by the output of a 10-bit comparator, with the comparator being located between a manually-set 10-bit switch and a 1-MHz 10-bit counter which is started by the H pulse and stopped by the comparator. The $J_\phi$ and $J_A$ signals can be generated by a second flip-flop which is set by a second comparator and reset by the trailing edge of the K pulse.

Figure 10:
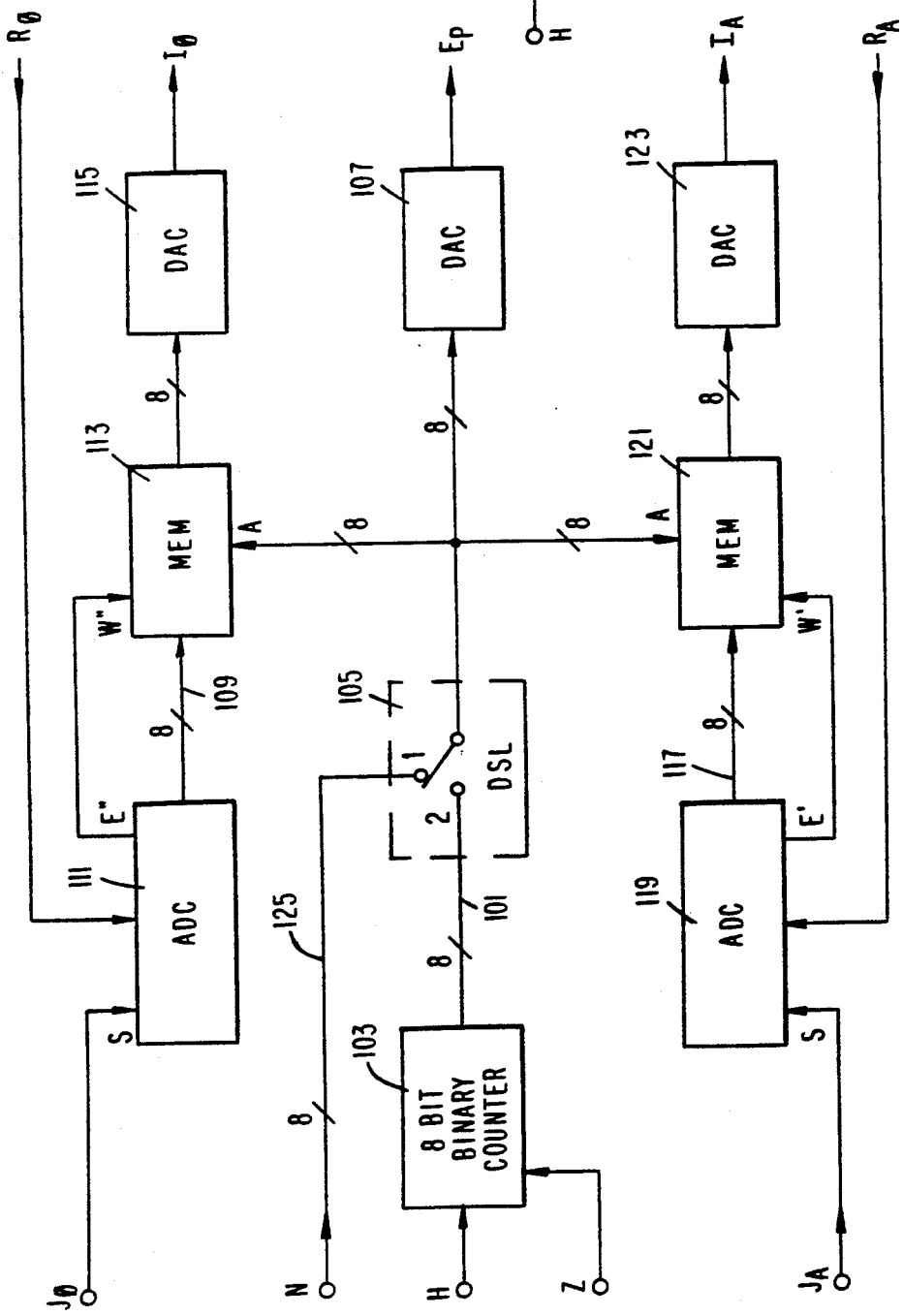
FIG. 10 shows in schematic diagram form the adaptive subsystem memory portion of secondary components in accordance with an embodiment of this invention.

Turning now to FIG. 10, the adaptive memory subsystem shown therein has the following components each of which may be of any suitable well known construction: In the first path 101 receiving the H and Z signals there is an 8-bit binary counter 103, an 8-bit data selector switch 105, and an 8-bit digital-to-analog converter 107. In a second channel 109 there is an analog-to-digital converter 111, a 56-byte random-access memory 113 and an 8-bit digital-to-analog converter 115. A third path 117 has an analog-to-digital converter 119, a 256-byte random access memory 121, and an 8-bit digital-to-analog converter 123. The subsystem has two analog inputs ($R_\phi$ and $R_A$), five logic inputs (N, $J_\phi$, $J_A$, Z, and H), and three analog outputs ($E_P$, $I_\phi$, and $I_A$).

The inputs $R_\phi$ and $R_A$ (and the outputs $E_P$, $I_\phi$, $I_A$) are the same as the correspondingly labelled outputs (and inputs) of the system described in connection with FIG. 7. The input H (and the inputs $J_\phi$ and $J_A$) are the same as the correspondingly labelled input (and outputs) of the timer 91 described in connection with FIG. 9. The input Z is a single rectangular pulse typically of 5-volt amplitude and 1.0 $\mu$sec duration, applied only when it is desired to reset the counter 103 to zero. Finally, the input N is provided on a path 125 and is a voltage-represented 8-bit binary number specifying the magnitude of the scaling input $E_P$ which is directly related to the desired amplitude of the klystron output voltage $V_o$ as discussed in connection with the subsystem of FIG. 7.

Referring further to FIG. 10, the data selector switch 105 has two 8-bit inputs and an 8-bit output. With the selector switch to receive the N signal on the path 125, as shown, its output is the subsystem input binary number N. Conversely, with the selector 105 in its other position connected to path 101, its output is made equal to the parallel output of the binary counter 103. The binary output of the selector 105 is made to serve three functions, i.e., as the data input to the digital-to-analog converter 107 and as 8-bit address inputs to the two memories 113 and 121. The analog inputs to the analog-to-digital converters 111 and 119 are the subsystem input signals $R_\phi$ and $R_A$, which are converted into binary form by the converters 111 and 119 if end only if they are so commanded by the earlier-described subsystem input signals $J_\phi$ and $J_A$. The binary outputs of the converters 111 and 119 serve as the respective data inputs to the two memories 113 and 121, with the required memory-write commands W' and W'' being the respective end-of conversion flags E' and E'' fed from the converters 111 and 119. By means of separate readout terminals, the data outputs of the two memories 113 and 121 are made to serve as the respective inputs to the two digital-to-analog converters 115 and 123. The respective outputs of digital-to-analog converters 115, 123, and 107 are the subsystem analog outputs $I_\phi$, $I_A$, and $E_P$.

Referring still to FIG. 10, the data selector 105 when placed in state-2 enables the output scaling voltage $E_P$ and the addresses of the memories 113 and 121 to be successively increased by one step in value each time the clock pulse H is applied to counter 103. This capability is useful in implementing a deliberate "training" sequence whereby every location in each of the memories 113 and 121 may be filled with the respective end-of-pulse $R_A$ and $R_\phi$ values learned by the integrators 69 and 77 in FIG. 7.

In summary, it will be seen that when the several parts of this invention as represented by the embodiments in FIGS. 7, 9, and 10 are interconnected as shown in FIG. 6, the result is an adaptive control system for pulsed megawatt klystrons having the UHF output $V_o$ and the inputs $E_{REF}$, H, N, and Z—and having the property of gradually speeding-up the responses of its own amplitude and phase control loops by automatically storing in its memory updated, corrected values based on the level of error in a previous klystron output pulse burst for establishing the initial conditions needed for each next klystron output pulse burst. The input $E_{REF}$ is a continuous UHF reference signal of fixed amplitude and prescribed phase. The input N is a binary number designating the desired amplitude of the klystron UHF output $V_o$. The input H is a brief rectangular trigger pulse, applied each time a klystron UHF output burst is desired.

Figure 11A:
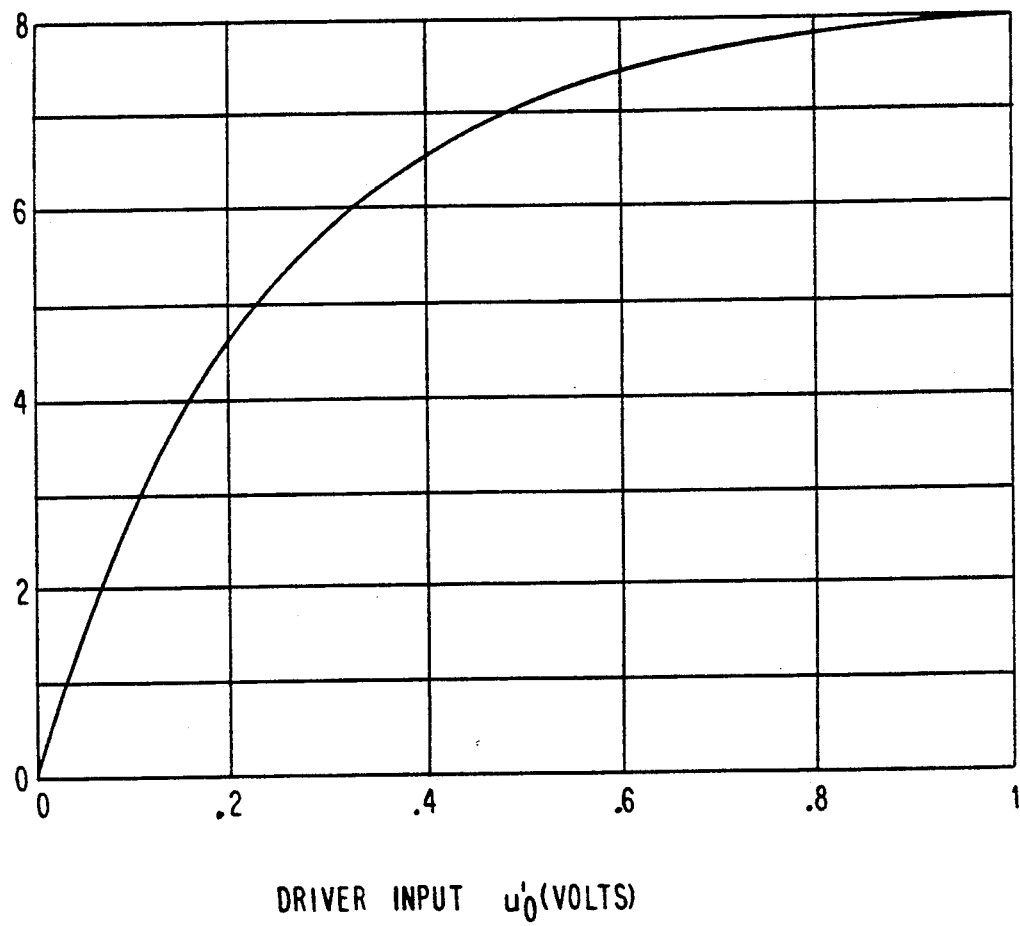
FIG. 11A shows a graph of klystron voltage response.
Figure 11B:
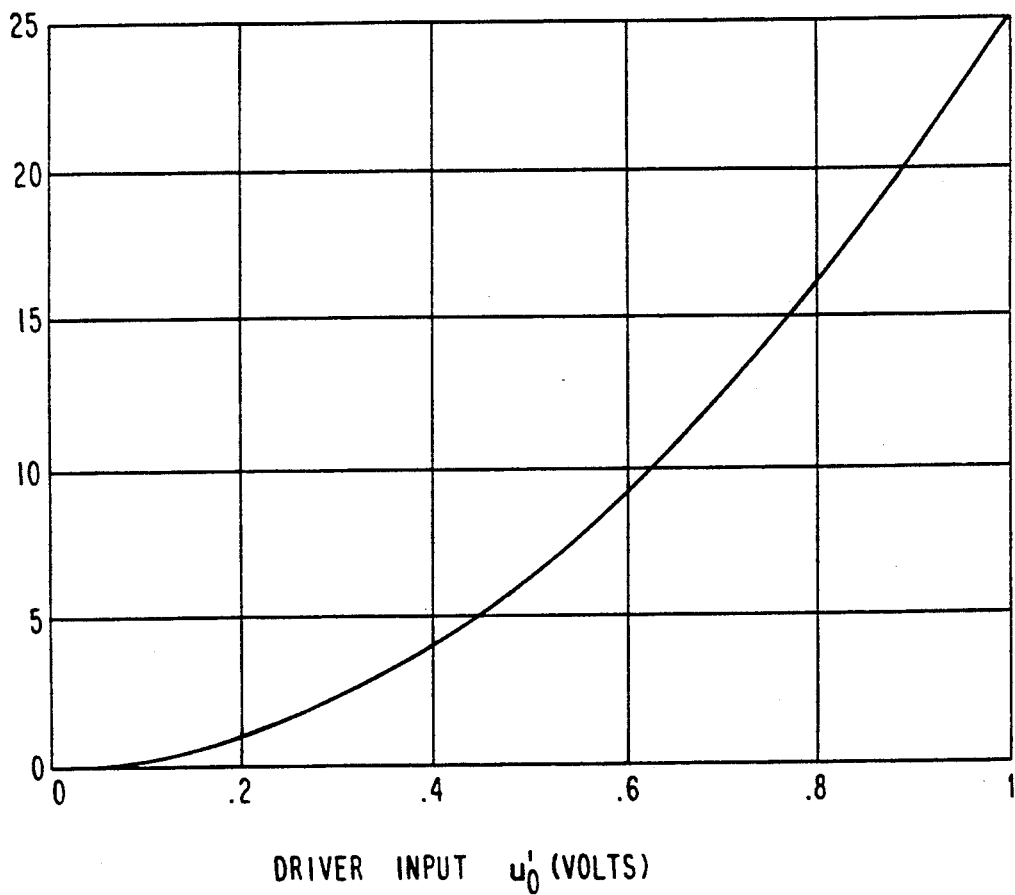
FIG. 11B shows a graph of klystron phase response.
Figure 11C:
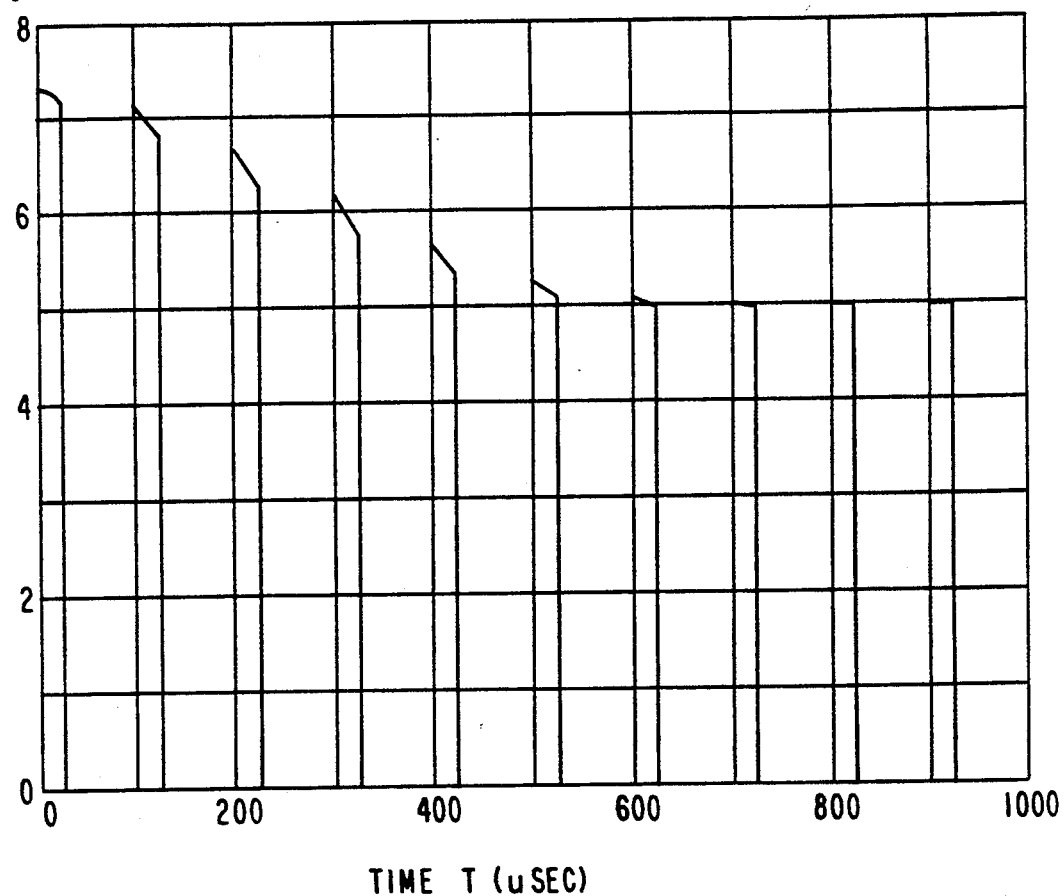
FIG. 11C is a graph explaining the adaptive pulse shaping of the invention; and, FIG. 11D is a graph explaining phase correction in accordance with the invention.
Figure 11D:
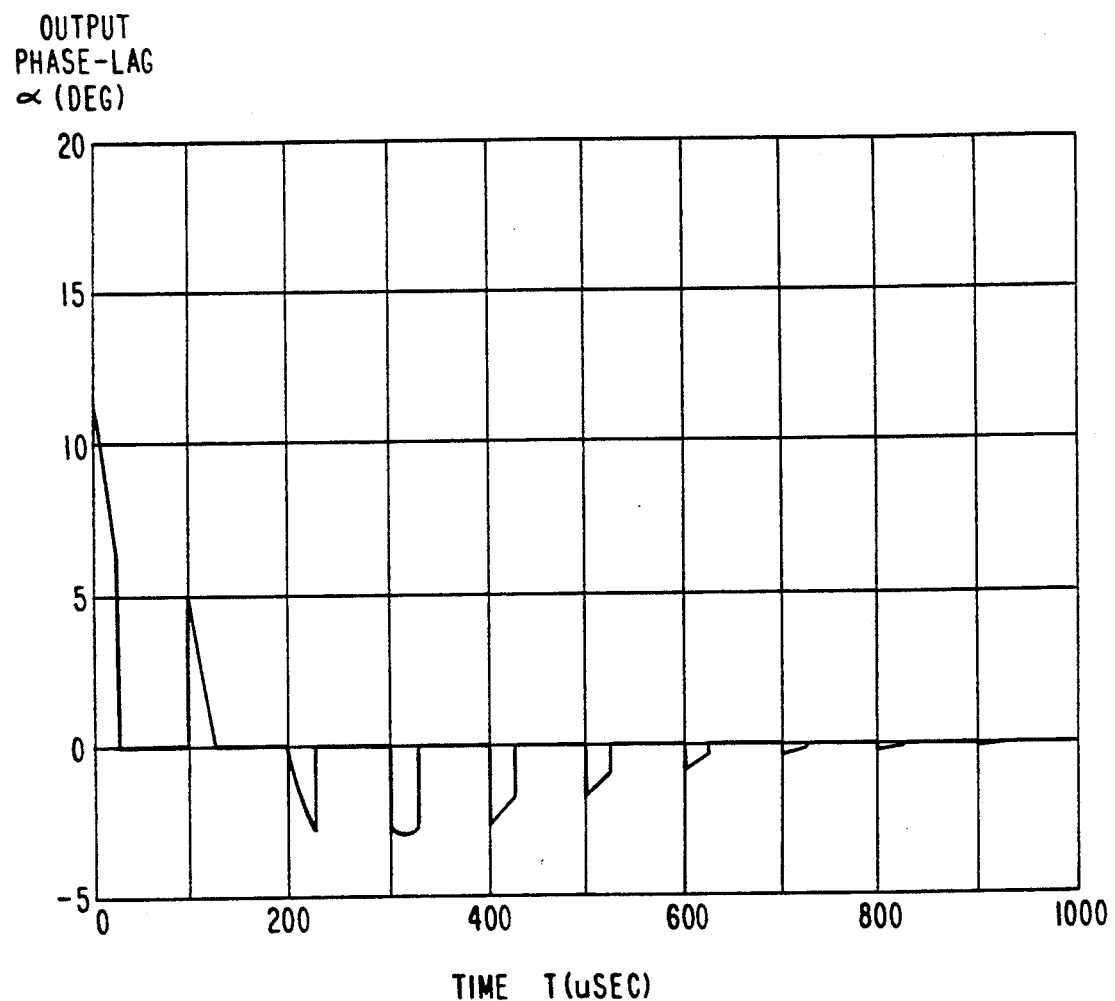

An example of the self-correcting performance of the overall system of this invention is illustrated in terms of waveform characteristics in FIGS. 11C and 11D, using the klystron amplitude and phase characteristics shown in FIGS. 11A and 11B. In this example, the data selector switch 105 in FIG. 10 is in its illustrated first position, and the binary input number N has a value calling for a klystron output amplitude of $V_o = 5$ kilovolts. Correspondingly, the output $E_P$ of the digital-to-analog converter 107 has a value of $E_P = \frac{5}{8} = 0.625$ volt, for which the klystron output amplitude and phase lag would be $V_o = 7.34$ kilovolts and $\alpha = 9.8$ degrees if uncorrected. Assuming that the system has received no previous conditioning, the memories 113 and 121 in FIG. 10 are initially filled with zeros. It is further assumed that the amplitude modulator 63 in FIG. 7 has an amplitude-dependent phase-lag error equal in this case to about 1.2 degrees.

For a series of ten applications of the trigger pulse H, the successive amplitudes and phase lags of the resulting klystron output pulses are shown in FIGS. 11C and 11D. The automatic adaptive correction of the amplitude $V_o$ from its 7.34-kilovolt initially-uncorrected value to its final 5-kilovolt desired value is associated with the incorporated principle in accordance with the invention that for the integrator 77 the $R_A$ value corresponding to trailing edge error learned and retained during one klystron output pulse during which the error was reduced is used as the $I_A$ value for the next pulse. Similarly, the automatic adaption of the phase lag $\alpha$ from its 11-degree initially-uncorrected value to its final zero-degree desired value is associated with the incorporated principle of the invention that for the integrator 69 the $R_\phi$ value corresponding to end-point error learned and retained during on klystron output pulse during which the error was reduced is used as the $I_\phi$ value for the next pulse. (The overshoot apparent in FIG. 11D is easily eliminated by increasing the time constant $T_\phi$ of the integrator 69.)

In FIGS. 11C and 11D it is seen that the final (tenth) pulse is of unchanging amplitude and phase, due to the fact that the system has learned to insert the exact corrections needed, with the result that the amplitude and phase error signals $E_A$ and $E_\phi$ are both zero throughout the duration of the pulse. If for any reason there is a slow drift in the klystron amplitude and phase characteristics, the system will automatically compensate by learning and retaining the new corrections needed.

Although the foregoing description is made with reference to various embodiments, it is readily apparent that various modifications can be made without departing from the essential principles of this invention. For example, the initializing signals $I_\phi$ and $I_A$ could be represented in binary form, with each of the two integrators replaced by a pre-loadable up-down counter preceded by a voltage-to-frequency converter and followed by a digital-to-analog converter. The binary resolution of the adaptive subsystem components may easily be increased from 8 bits to 12 or more bits. In many circumstances the phase and amplitude compensation circuits inside the klystron driver can simply be omitted.

The secondary memory unit can be augmented to include two additional memories to store the appropriate initial conditions for the low-pass filter in the phase detector and the low-pass filter in the amplitude difference unit.

Still further, new modes of operation involving midburst changes in the amplitude of the klystron output can be accommodated by moderately reducing the integrator time constants. Also, by augmenting the two memories with data-smoothing microprocessors, each newly learned pair of $I_\phi$ and $I_A$ entries can be stored without perceptible discontinuity from neighboring entries in the memories.

What is claimed:

1. The method of speeding up error correcting responses of waveform control systems such as control loops which adjust waveform characteristics such as phase and/or amplitude of a non-linear pulsed output device susceptible to drift and interdependent phase-amplitude effects, by reducing initial errors in the waveform characteristics occurring in the beginning of output pulses of the pulsed output device, said output pulses being adjustable through the waveform control system to reduce the extent of error in the waveform characteristics therein, there nevertheless remaining in the waveform control system at the end of the last preceding output pulse an amount of uncorrected error in the waveform characteristics normally due to drift in the output device or transients in the control loop, the method comprising the steps of:

a. storing in a computer memory a signal value for each waveform characteristic based on the level of error in the waveform characteristic at the end of the previous output pulse of the pulsed output device, each said signal value thus being constant over long periods and not susceptible to deterioration, leakage, or charging;

b. producing a control voltage corresponding to each of said stored signal values; and, c. applying each control voltage to the pulsed output device to thereby limit the initial error in each waveform characteristic of the next output pulse to essentially the exact level of error existing in the waveform characteristic at the end of the preceding pulse, whereby the amount of error that needs to be corrected in the waveform control system is limited to the level of error including zero existing in the waveform characteristic at the end of the preceding output pulse, and further, whereby the individual characteristics of drift of the pulsed output device are retained and thus learned.

2. The method of claim 1 wherein the desired output pulses are essentially rectangular.

3. The method of claim 2 wherein the waveform characteristics comprise phase and amplitude.

4. The method of claim 3 wherein the output device is a pulsed radio frequency device.

5. The method of claim 2 wherein the device is a klystron.

6. The method of claim 1 wherein the stored signal value for each waveform characteristic comprises a plurality of different end-of-pulse values for each waveform characteristic.

7. The method of claim 3 wherein the step of producing each control voltage comprises:

i. providing phase and amplitude reference voltages;

ii. measuring the difference in phase and amplitude between the phase and amplitude reference voltages and the output pulses;

iii. producing phase and amplitude control voltages corresponding to the measured differences in phase and amplitude;

iv. integrating the measured differences between phase and amplitude to provide analog voltages respectively representing said phase and amplitude differences;

v. converting the analog voltages into digital signals; and, vi. retaining the digital signals in the computer memory as a basis for phase and amplitude modulating the beginning of the next output pulse.

8. The method of claim 7 comprising the additional step of:

vii. converting the digital signals to analog signals for amplitude and phase modulating the output device.

9. Apparatus for speeding up error correcting responses for waveform control systems such as control loops which adjust waveform characteristics including phase and/or amplitude of a non-linear pulsed output device susceptible to drift and interdependent phase-amplitude effects, by reducing initial errors in the waveform characteristics occurring in the beginning of pulses of the pulsed output device, said output pulses being adjustable through the waveform control system to reduce the extent of error in the waveform characteristic therein, there nevertheless remaining in the waveform control system at the end of the last preceding output pulse an amount of uncorrected error in the waveform characteristic due to drift in the pulsed output device or transients in the waveform control system, comprising:

a. means for storing in a computer memory a signal value for each waveform characteristic based on the level of error in the waveform characteristic at the end of the previous output pulse of the pulsed output device, said memory being characterized by the property of sustaining each said signal value at a constant level for a long period without deterioration or leakage;

b. means for producing a control voltage corresponding to each of said stored signal values;

c. means for applying each control voltage to the pulsed output device to thereby limit the initial error in each waveform characteristic of the next output pulse of the device to essentially the exact level of error existing in the waveform characteristic at the end of the preceding pulse, whereby the amount of error that needs to be corrected in the waveform control system is limited to the level of error including zero existing in the waveform characteristic at the end of the preceding output pulse and further, whereby the individual characteristics of drift of the pulsed output device are retained and thus learned.

10. Apparatus in accordance with claim 9 wherein the output pulses are rectangular.

11. Apparatus in accordance with claim 10 wherein the waveform characteristics are phase and amplitude.

12. Apparatus in accordance with claim 11 wherein the output device is a pulsed radio frequency device.

13. Apparatus in accordance with claim 12 wherein the pulsed radio frequency device is a klystron.

14. Apparatus for accelerating error correcting responses for controlling output pulses produced by a non-linear pulsed output device characterized by drift and interdependent phase-amplitude effects, said apparatus affording a limit on the correction needed for a next pulse of the output device by remembering the phase and amplitude error level at the end of the preceding pulse and limiting the initial phase and amplitude correction in the next pulse to that level, said apparatus comprising:
- a. means for providing phase and amplitude reference voltages;
- b. means for measuring the differences in phase and amplitude between said reference voltages and the output pulses the last of which is always the preceding pulse;
- c. means for integrating the measured difference between phase and amplitude to provide analog voltages respectively representing a continuing update of said phase and amplitude differences;
- d. converting said phase and amplitude analog voltages into digital signals;
- e. a computer having a memory section for receiving and storing said digital phase and amplitude signals including those representing an update of said phase and amplitude differences relating to the preceding output pulse;
- f. means for receiving from said computer said stored digital phase and amplitude signals at selected times and converting said signals into analog signals;
- g. modulating means for receiving via said integrating means said analog signals corresponding to updated phase and amplitude differences related to the phase and amplitude error of the preceding pulse to provide phase modulation and amplitude summation signals selectively switchable to control and limit the change in initial phase and amplitude of the next pulse of the pulsed output device to the levels of phase and amplitude error at the end of the preceding pulse.

15. Apparatus in accordance with claim 14 wherein the pulsed output device is a pulsed radio frequency device.

16. Apparatus in accordance with claim 14 wherein said pulsed output device is a klystron.

* * * * *